United States Patent [19]

Kuech et al.

[11] Patent Number: 5,098,857
[45] Date of Patent: Mar. 24, 1992

[54] METHOD OF MAKING SEMI-INSULATING GALLIUM ARSENIDE BY OXYGEN DOPING IN METAL-ORGANIC VAPOR PHASE EPITAXY

[75] Inventors: Thomas F. Kuech, Peekskill; Michael A. Tischler, Croton-on-Hudson, both of N.Y.

[73] Assignee: International Business Machines Corp., Armonk, N.Y.

[21] Appl. No.: 455,695

[22] Filed: Dec. 22, 1989

[51] Int. Cl.$^5$ .............................. H01L 21/20
[52] U.S. Cl. .................... 437/107; 437/94; 437/95; 437/959; 156/613
[58] Field of Search ............ 148/DIG. 7, 18, 22, 148/23, 40, 56, 65, 95, 97, 110, 129, 155, 169, 33, 33.1, 33.4; 156/610–614; 427/248.1, 255.1; 437/81, 85, 95, 94, 96, 105, 107, 247, 936, 939, 951, 959, 971, 987

[56] References Cited

U.S. PATENT DOCUMENTS

| | | | |
|---|---|---|---|
| 3,511,703 | 5/1970 | Peterson | 437/238 |
| 3,657,007 | 4/1972 | Pammer | 437/238 |
| 3,698,071 | 10/1972 | Hall | 437/241 |
| 4,216,036 | 8/1980 | Tsang | 437/238 |
| 4,253,887 | 3/1981 | Jolly | 156/612 |
| 4,286,373 | 9/1981 | Gutierrez et al. | 437/86 |
| 4,297,783 | 11/1981 | Casey, Jr. et al. | 437/107 |
| 4,421,576 | 12/1983 | Jolly | 156/613 |
| 4,448,797 | 5/1984 | Burnham | 437/80 |
| 4,592,793 | 6/1986 | Hovel et al. | 437/168 |
| 4,623,426 | 11/1986 | Peters | 437/81 |
| 4,939,043 | 7/1990 | Biricik et al. | 148/33.1 |

FOREIGN PATENT DOCUMENTS 0220432 9/1989 Japan .
0261818 10/1989 Japan .

OTHER PUBLICATIONS

Terao, H. et al., "Effects of Oxygen and Water Vapor Introduction During MOCVD Growth of GaAlAs", *Journal of Crystal Growth*, 68: 157, (1984).

Lagowski, J., et al., "Identification of Oxygen-Related Midgap Level in GaAs", *Applied Physics Letters* 443: 336, (1984).

Ruby, D. S., et al., "Deep Level Electron Traps in Vapor Phase Epitaxial GaAs Grown with Oxygen Injection", *Journal of Applied Physics*, 58: 825, (1985).

Wallis, R. H., "Effect of Oxygen Injection During VPE Growth of GaAs and $Al_xGa_{1-x}As$", *Institute of Physics Conference*, 56 (1): 73, (1981).

Kuech, T. F., "Metal-Organic Vapor Phase Epitaxy of Compound Semiconductors", *Materials Science Reports* 2(1): (1987).

Akiyama, M. et al., "Growth of Vanadium-doped semi-insulating GaAs by MOCVD" *Journal of Crystal Growth*, 68: 39, (1984).

T. F. Kuech et al., "Properties of High Purity $Al_xGa_{1-x}As$ Grown By The Metal-Organic Vapor-Phase-Epitaxy Technique Using Methyl Precursors", Journal of applied Physics, 62(2):632, (1987).

*Primary Examiner*—Olik Chaudhuri
*Assistant Examiner*—William D. Bunch
*Attorney, Agent, or Firm*—Scully, Scott, Murphy & Presser

[57] ABSTRACT

A method of forming semi-insulating gallium arsenide by oxygen doping in a metal-organic vapor phase epitaxy system. The metal organic reactant gas containing aluminum and oxygen is introduced into the reaction chamber together with the gallium and arsenic containing reactant gases. A deep level oxygen impurity is incorporated into the growing gallium arsenide layer to form semi-insulating gallium arsenide.

10 Claims, 2 Drawing Sheets

METHOD OF MAKING SEMI-INSULATING GALLIUM ARSENIDE BY OXYGEN DOPING IN METAL-ORGANIC VAPOR PHASE EPITAXY

BACKGROUND OF THE INVENTION

1. Field of the Invention

The present invention relates to a method of depositing layers of semi-insulating gallium arsenide and more particularly to a metal-organic vapor phase epitaxy process for depositing oxygen doped gallium arsenide on a substrate.

2. Description of the Prior Art

The formation of epitaxial layers of semi-insulating gallium arsenide is highly desirable for many device applications, such as MESFETS. Semi-insulating behavior in bulk gallium arsenide is obtained by the introduction of either a native defect, EL2, or a deep level impurity such as chromium. However, high quality semi-insulating gallium arsenide bulk substrates are expensive. In addition, it is desirable to form the semi-insulating layer by using the same basic thin film or epitaxial techniques as are used to form the semiconductor device material.

In epitaxial films, semi-insulating behavior has been obtained in gallium arsenide only when a transition metal has been introduced into the growing layer. Akiyama et al. in J. Crystal Growth 68(1984) disclose incorporation of chromium and vanadium in a metal-organic vapor phase epitaxy system to create semi-insulating gallium arsenide. However, transition metals tend to diffuse quickly through the gallium arsenide resulting in undesired impurity redistribution. The vanadium source used by Akiyama et al. was triethoxyvanadyl (TEV): $VO_2(OC_2H_5)_3$ and the authors surmised that the oxygen in the compound may also have contributed to the formation of the deep levels.

It is known in the art that oxygen can create a deep level in gallium arsenide. Lagowski et al. in Appl. Phys. Lett. 44(3) 1984, disclose the formation of an oxygen deep level close to the EL2 level in energy by introducing $Ga_2O_3$ into a Bridgeman-type apparatus to form oxygen doped gallium arsenide. However, attempts to form oxygen deep levels in epitaxial gallium arsenide have been unsuccessful, as shown by Ruby et al., J. Appl. Phys. 58(2) 1985, in which the introduction of pure oxygen in a $AsCl_3$ vapor phase epitaxy system did not result in an oxygen deep level, and by Wallis, Inst. Phys. Conf. Ser. No. 56: Chapt. 1 (1981) in which the introduction of oxygen from water vapor into a metal-organic vapor phase epitaxy system resulted in no oxygen being incorporated during the growth of gallium arsenide. These attempts have not led to oxygen incorporation since the formation of either gallium or arsenic oxides is thermodynamically unfavorable under the typical metal-organic vapor phase epitaxy conditions of high temperatures and in a hydrogen carrier gas. See, Kuech et al., J. Appl. Phys. 62 (1987). However, U.S. Pat. No. 4,253,887 to Jolly, discloses the formation of oxygen doped gallium arsenide in an $AsH_3/GaCl_3$ vapor phase epitaxy system by the introduction of water vapor, the results of which are apparently limited to the $AsH_3/GaCl_3$ system in view of the teachings of Ruby et al. noted above.

There have been successful attempts of forming oxygen doped semi-insulating aluminum gallium arsenide. Terao et al., J. Crystal Growth 68 (1984) disclose that the introduction of $H_2O$ or $O_2$ into an metal-organic vapor phase epitaxy reactor in which gallium arsenide is being grown by trimethyl gallium, trimethyl aluminum and arsine will result in oxygen being incorporated into the growing gallium arsenide. However, there remains a need for a method to form oxygen doped gallium arsenide in a metal-organic vapor phase epitaxy system.

SUMMARY OF THE INVENTION

The present invention is directed to a method for controllably introducing oxygen into gallium arsenide during epitaxial growth using metal-organic vapor phase epitaxy techniques. In the method of the invention, an aluminum-metal organic compound which contains oxygen as part of the molecule is introduced into the metal-organic vapor phase epitaxy reaction chamber together with any known gallium and arsenic reactant gases. The result of the reaction is the formation of a deep level oxygen impurity in the gallium arsenide layer being grown. In addition, a small amount of aluminum is also incorporated into the gallium arsenide. However, the low levels of aluminum do not affect the characteristics of the gallium arsenide layer. The metal-organic reactant gas containing aluminum and oxygen is an aluminum alkoxide of the formula:

$$R_2AlOR',$$

wherein R is organic ligand and R' is an organic ligand the same as or different from R. R and R' are conventional simple hydrocarbon ligands such as $CH_3$, $C_2H_5$ or $C_3H_7$. The introduction of the alkoxide described above during the growth of gallium arsenide results in the controlled introduction of oxygen into the growing layer resulting in epitaxial oxygen doped semi-insulating gallium arsenide.

DETAILED DESCRIPTION OF THE INVENTION

The method of the present invention for depositing semi-insulating gallium arsenide utilizes the conventional techniques of metal-organic vapor phase epitaxy of compound semiconductors which are described by Kuech in Materials Science Reports, 2, (1) 1987. The general embodiment of the technique utilizes the reaction of a reactive metal-organic compound, generally a metal alkyl, such as $Ga(CH_3)_3$ and $Ga(C_2H_5)_3$, with a hydride of a non-metal species, such as $AsH_3$. The Group III metal-organic compounds are typically high vapor pressure liquids or solids and the Group V hydrides are generally highly toxic gases. The growth ambient in the reactor consists of a carefully controlled mixture of the metal-organic precursors and hydrides in a carrier gas, typically $H_2$ or $N_2$. Typical gallium sources include trimethyl gallium (TMG) and triethyl gallium (TEG). The typical arsenic sources are arsine ($AsH_3$) and arsine substitutes, such as tertiary butyl arsine, isobutyl arsine and phenol arsine. The mixture of the gaseous constituents in the reaction chamber is heated to a temperature at which the gases decompose to provide gallium and arsenic which combine and deposit on the substrate as gallium arsenide.

To obtain the deposition of semi-insulating gallium arsenide in accordance with the present invention, a metal-organic reactant gas containing aluminum and oxygen is also introduced into the metal-organic vapor phase epitaxy reaction chamber. The addition of an aluminum alkoxide results in oxygen being incorporated into the growing gallium arsenide crystal creating a deep level impurity. Thus, the deposited gallium arsenide layer is oxygen doped so as to be semi-insulating.

Figure 1:
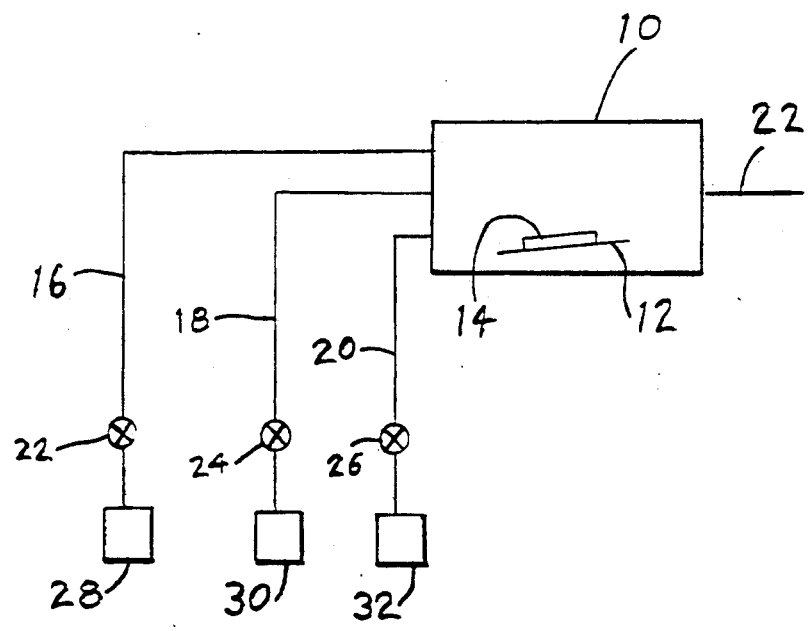
FIG. 1 is a schematic diagram of a metal-organic vapor phase epitaxy reaction chamber suitable for carrying out the method of the present invention.

Referring to the drawings, FIG. 1 shows a reaction chamber 10 which includes therein a support 12 holding a substrate 14 on which the layer of semi-insulating gallium arsenide is to be deposited. Inlet lines 16, 18 and 20 are provided for introducing the reactant gases and exhaust line 22 is provided for the exhaustion of unreacted gases. Line 16 is used to introduce the gallium containing reactant gas such as TMG or TEG and line 18 is used to introduce the arsenic containing reactant gas, AsH$_3$. Line 20 is used to introduce the aluminum alkoxide reactant gas. Valves 22, 24 and 26 control the flow of the reactant gases from source containers 28, 30 and 32.

In using the metal-organic vapor phase epitaxy system shown in FIG. 1 to deposit a layer of semi-insulating gallium arsenide on the substrate 14, a flow of gaseous TMG or TEG is introduced through line 16, a flow of gaseous AsH$_3$ is introduced through line 18, and a flow of a gaseous aluminum alkoxide is introduced through line 20. The aluminum alkoxide is of the formula:

$$R_2AlOR',$$

wherein R is an organic ligand and R' is an organic ligand the same as or different from R. The organic ligands suitable for use in the method of the present invention are conventional hydrocarbon ligands such as $CH_3$, $C_2H_5$ and $C_3H_7$.

The mole fraction of the gallium reactant gas is in the range of about $10^{-5}$ to $10^{-4}$ and the mole fraction of the arsine is in the range of about $10^{-4}$ to $10^{-3}$. The mole fraction of the aluminum alkoxide is in the range of $10^{-9}$ to $10^{-4}$. The temperature in the reaction chamber is in the range of about 500 to 800° C. and the pressure in the reaction chamber is in the range of about 1 to 760 Torr.

The mixture of the reactant gas constituents is heated in the reaction chamber and decomposes to provide the epitaxial growth of a layer of gallium arsenide in which a deep level of oxygen is incorporated. A low level of aluminum is also incorporated into the growing gallium arsenide crystal. However, the small trace amount of aluminum in the crystal does not affect the performance or characteristics of the gallium arsenide layer since it is an isoelectronic impurity which forms a complete solid solution with gallium arsenide. The concentration of oxygen doping in the gallium arsenide layer is in the range of about $10^{14}$ to $10^{18}$ cm$^{-3}$. The concentration of the aluminum in the gallium arsenide layer is proportional to the oxygen content and is generally in the range of about $10^{16}$ to $10^{20}$ cm$^{-3}$. The deep level oxygen impurity provides a semi-insulating gallium arsenide layer.

EXAMPLE

Figure 2:
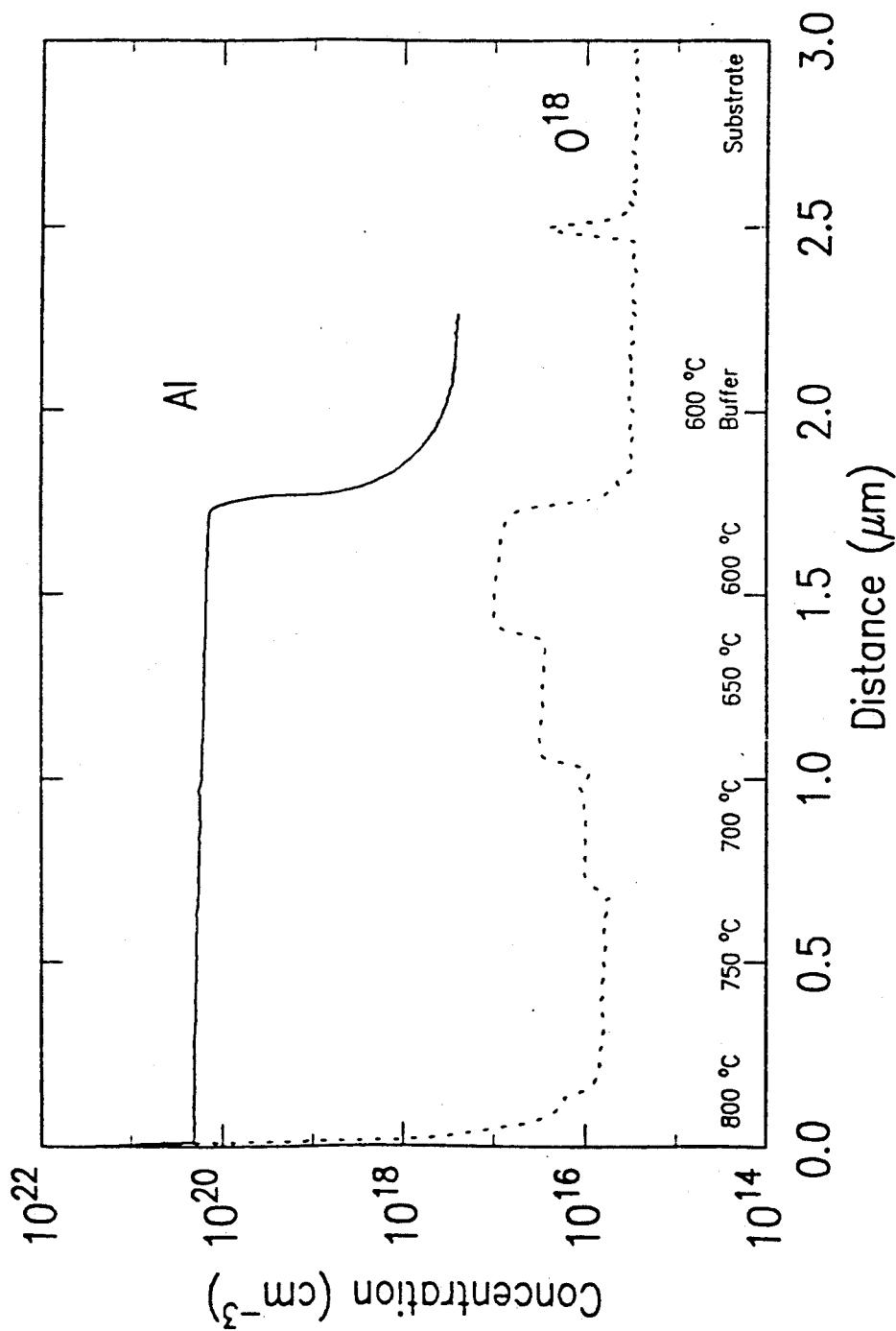
FIG. 2 illustrates the level of concentration of oxygen and aluminum plotted as a function of distance in the gallium arsenide layer and substrate.

A semi-insulating gallium arsenide layer was epitaxially deposited on a gallium arsenide substrate in a metal-organic vapor phase epitaxy system. The gallium containing reactant gas was TMG having a mole fraction of $2 \times 10^{-4}$. AsH$_3$ was used as the arsenic containing reactant gas having a mole fraction of $8 \times 10^{-3}$. The aluminum alkoxide was $(CH_3)_2AlOCH_3$ having a mole fraction of $5 \times 10^{-8}$. The flow rate of TMG was 1.5 SCCM, the flow rate of AsH$_3$ was 60 SCCM and the flow rate of $(CH_3)_2AlOCH_3$ was $3.7 \times 10^{-4}$ SCCM. The reactor pressure was 78 Torr. The temperature was changed in steps from 600 to 800° C. The mixture of the reactant gases decomposed to form gallium arsenide with an oxygen deep level and a trace amount of aluminum. The deposition was carried out for 40 minutes and provided an oxygen doped semi-insulating gallium arsenide layer of 1.8 microns in thickness. FIG. 2 shows the concentration of oxygen and aluminum as a function of the gallium arsenide layer thickness at the various temperature steps. The buffer layer was 1.8 microns thick and was comprised of gallium arsenide. The concentration of oxygen and aluminum was measured by secondary ion mass spectroscopy. The presence of the oxygen deep level was determined by electrical tests such as deep level transient spectroscopy.

Thus, it can be seen that the method of the present invention provides an epitaxial layer of oxygen doped gallium arsenide that is semi-insulating.

While the invention has been particularly shown and described with respect to the preferred embodiments thereof, it should be understood by those skilled in the art that the foregoing and other changes in form and detail may be made therein without departing from the spirit and scope of the invention which should be limited only by the scope of the appended claims.

What is claimed is:

1. A method of forming semi-insulating gallium arsenide on a substrate comprising the steps of:
   introducing a reactant gas containing gallium, a reactant gas containing arsenic and a reactant gas of an aluminum alkoxide into an metal-organic vapor phase epitaxy reaction chamber, said aluminum alkoxide is of the formula:

$$R_2AlOR'$$

wherein:
   R is an organic ligand and
   R' is an organic ligand the same as or different from R; and
   reacting said gases too deposit an epitaxial layer of oxygen doped gallium arsenide on said substrate.

2. The method of claim 1 wherein R and R' are selected from the group consisting of $CH_3$, $C_2H_5$ and $C_3H_7$.

3. The method of claim 1 wherein the reactant gases include trimethyl gallium and arsine.

4. The method of claim 1 wherein the reactant gases include triethyl gallium and arsine.

5. The method of claim 3 wherein the concentration of oxygen doping is in the range of about $10^{14}$ to $10^{18}$ cm$^{-3}$.

6. The method of claim 5 where the mole fraction of said aluminum alkoxide reactant gas is in the range of about $10^{-9}$ to $10^{-4}$.

7. The method of claim 6 wherein the temperature of the reaction chamber is in the range of about 500 to 800° C.

8. The method of claim 7 wherein the pressure in the reaction chamber is in the range of about 1 to 760 Torr.

9. A method of forming semi-insulating gallium arsenide on a substrate comprising the steps of:

introducing a reactant gas containing gallium, a reactant gas containing arsenic and a metal-organic reactant gas containing aluminum and oxygen into an metal-organic vapor phase epitaxy reaction chamber, sad metal-organic reactant gas is an aluminum alkoxide of the formula:

$$R_2AlOR'$$

wherein:
R is an organic ligand and
R' is an organic ligand the same as or different from R; and reacting said gases to deposit an epitaxial layer of gallium arsenide having a deep level oxygen impurity to provide a semi-insulating layer of gallium arsenide on said substrate.

10. The method of claim 9 wherein R and R' are selected from the group consisting of $CH_3$, $C_2H_5$ and $C_3H_7$.

* * * * *

UNITED STATES PATENT AND TRADEMARK OFFICE
CERTIFICATE OF CORRECTION

PATENT NO. : 5,098,857
DATED : March 24, 1992
INVENTOR(S) : Thomas F. Kuech, et al.

It is certified that error appears in the above-identified patent and that said Letters Patent is hereby corrected as shown below:

Column 1, line 35: "$VO_2(OC_2H_5)_3$" should read as --$VO(OC_2H_5)_3$--

Column 2, line 28: "is organic" should read as --is an organic--

Column 4, line 49, Claim 1: "too" should read as --to--

Column 5, line 8, Claim 9: "sad" should read as --said--

Signed and Sealed this

Twenty-second Day of June, 1993

Attest:

MICHAEL K. KIRK

*Attesting Officer*     *Acting Commissioner of Patents and Trademarks*